United States Patent
Nishikawa et al.

(10) Patent No.: US 6,932,666 B2
(45) Date of Patent: Aug. 23, 2005

(54) ORGANIC ELECTROLUMINESCENCE PANEL AND METHOD FOR MANUFACTURING THE SAME

(75) Inventors: Ryuji Nishikawa, Gifu (JP); Norihiro Ikeda, Gifu (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 10/463,636

(22) Filed: Jun. 16, 2003

(65) Prior Publication Data

US 2003/0230976 A1 Dec. 18, 2003

(30) Foreign Application Priority Data

Jun. 17, 2002 (JP) .................................... 2002-176358
Jun. 10, 2003 (JP) .................................... 2003-165459

(51) Int. Cl.[7] .............................. H01J 9/24; H01J 9/00; G09G 3/20; H05B 33/10
(52) U.S. Cl. ......................... 445/25; 428/690; 445/24
(58) Field of Search ................... 445/24, 25; 428/690; 313/498, 500, 503, 506, 512

(56) References Cited

U.S. PATENT DOCUMENTS

| 5,707,747 | A | * | 1/1998 | Tomiyama et al. | ......... 428/457 |
|---|---|---|---|---|---|
| 5,834,894 | A | * | 11/1998 | Shirasaki et al. | ........... 313/509 |
| 6,198,217 | B1 | * | 3/2001 | Suzuki et al. | ................ 313/504 |
| 6,281,552 | B1 | * | 8/2001 | Kawasaki et al. | .......... 257/350 |
| 6,475,648 | B1 | * | 11/2002 | Hatwar et al. | .............. 428/690 |
| 6,780,529 | B2 | * | 8/2004 | Kimura | ...................... 428/690 |

* cited by examiner

*Primary Examiner*—Nimeshkumar D. Patel
*Assistant Examiner*—Sharlene Leurig
(74) *Attorney, Agent, or Firm*—Cantor Colburn LLP

(57) ABSTRACT

On a cathode (40) of an organic EL element, a stress reducing layer (42) formed by a material which is the same as that used for an organic layer of the organic EL element is formed. A moisture block layer (44) formed by a material which is the same as that used for the cathode (40) is then formed on the stress reducing layer (42). Thus, entering of moisture is effective prevented while the stress is reduced.

6 Claims, 3 Drawing Sheets

ORGANIC ELECTROLUMINESCENCE PANEL AND METHOD FOR MANUFACTURING THE SAME

BACKGROUND OF THE INVENTION

1. Field of the Invention

The present invention relates to an organic electroluminescence (EL) panel having organic EL elements arranged in a matrix on a substrate, and more particularly to such an organic EL panel which can effectively prevent moisture from entering the organic EL elements.

2. Description of Related Art

Organic EL display panels have conventionally been known as one example of flat display panels. Because, unlike liquid crystal display (LCD) panels, organic EL display panels are self emissive and because organic EL display panels are bright and clear flat display panels, their widespread use is highly expected., An organic EL display comprises a great number of organic EL elements arranged in a matrix, and employs these organic EL elements as pixels of a display. Such organic EL displays can be driven passively or actively, similar to LCDs, and, also as is the case with LCDS, active matrix displays are more preferable. More specifically, in active matrix displays, switching elements (typically two elements including a switching element and a driving element) are provided for each pixel and display of each pixel is controlled by controlling the switching elements, whereas in passive driving, a switching element is not provided for each pixel. Of these two types of displays, the active matrix is more preferable because much more precise displays can be achieved.

The organic EL element emits light when current flows through an organic emissive layer. In many cases, a hole transport layer and an electron transport layer formed of an organic material are provided adjacent to the organic emissive layer so as to assist light emission. These organic layers are apt to degrade when exposed to moisture.

Accordingly, in organic EL displays, in order to remove moisture from the organic layers, a cathode formed of a metal is provided for covering the upper portion of the organic EL element while a space above the display region (a region where pixels are provided) in which the organic EL element is disposed is made air proof and a drying agent is provided in this space.

However, there remains a demand for more reliable prevention of diffusion of moisture into the organic layers of the organic EL element. Although it is possible to increase the thickness of the cathode as a solution, for example, when the thickness is too large, the cathode would be deformed and peeled due to the resulting stress.

SUMMARY OF THE INVENTION

The present invention advantageously enables reliable prevention of moisture diffusion.

In accordance with one aspect of the present invention, a moisture block layer is provided on a cathode so that intrusion of moisture into the organic EL element, which is formed under the cathode, can be prevented more reliably. Further, because the moisture block layer is provided via a stress reducing layer, not directly, on the cathode, the stress of the moisture block layer and of the cathode can be suppressed and deformation of these layers can be reduced.

DETAILED DESCRIPTION OF THE PREFERRED EMBODIMENT

A preferred embodiment of the present invention will be described with reference to the accompanying drawings.

Figure 1:
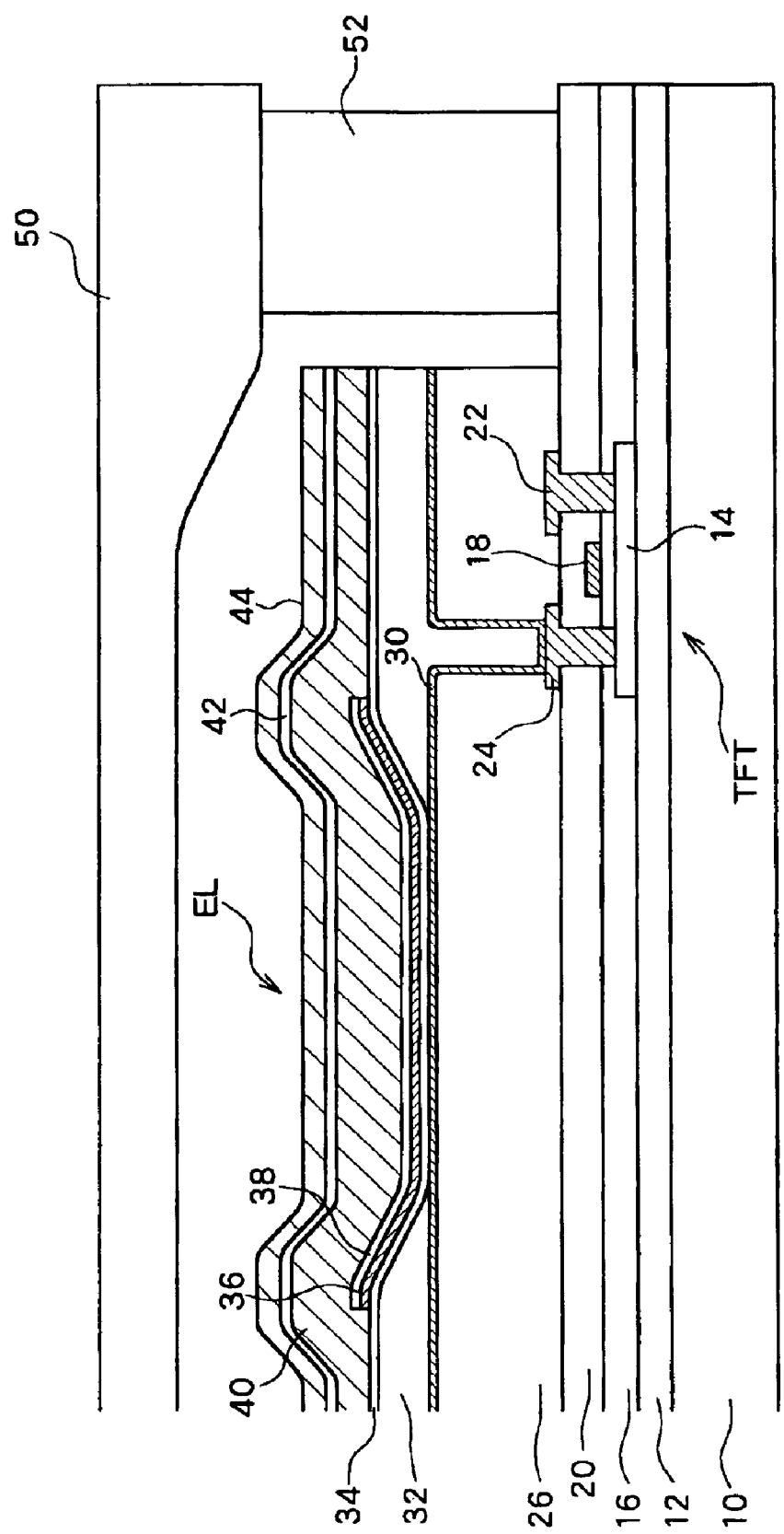
FIG. 1 is a cross sectional view showing a main portion of a configuration according to an embodiment of the present invention.

FIG. 1 is a cross sectional view showing a main portion of one preferred embodiment of the present invention. On a glass substrate 10, an insulating layer 12 formed of two layers, an $SiO_2$ layer and an SiNx layer, which are accumulated in this order, is provided so as to prevent impurities from entering the glass substrate 10. On predetermined portions of the insulating layer 12, a great number of thin film transistors are formed. Although in FIG. 1, a second TFT which is a thin film transistor for controlling current flowing from a power source line to the organic EL element is shown, a first TFT (a switching TFT) is also provided for each pixel for controlling accumulation of voltages supplied from the data line into a capacitor. The second TFT is switched on in accordance with the voltage accumulated in the capacitor for controlling current flowing from the power source line to the organic EL element.

On the insulating layer 12, a semiconductor layer 14 which is formed of poly-Si and constitutes an active layer, is formed. Then, a gate insulating film 16 formed of two layers, an $SiO_2$ layer and an SiNx layer, which are accumulated in this order, is formed so as to cover the semiconductor layer 14. A gate electrode 18 formed of Mo or the like is provided via the gate insulating film 16 above the center portion of the semiconductor layer 14. An inter-layer insulating film 20 formed of two layers, an SiNx layer and an $SiO_2$ layer, which are accumulated in that order, is further formed so as to cover the semiconductor layer 14, the gate insulating layer 16, and the gate electrode 18. Further, towards ends on the semiconductor layer 14, a drain electrode 22 and a source electrode 24 made of aluminum, for example, are formed by forming a contact hole through the inter-layer insulating film 20 and the gate insulating film 16.

Then, a first planarization film 26 formed of an organic material such as an acrylic resin is formed so as to cover the inter-layer insulating film 20, the drain electrode 22, and the source electrode 24. On the first planarization film 26, a transparent electrode 30 formed of a material such as ITO is formed so as to serve as an anode of the organic EL element for each pixel.

A part of the transparent electrode 30 extends down on the source electrode 24, where the transparent electrode 30 is formed along the inner surface of a contact hole through which the upper end of the source electrode 24 is exposed. In this manner, the source electrode 24 is directly connected with the transparent electrode 30.

Further, portions of the transparent electrode 30 formed in the peripheral region of the pixel area, which corresponds to an area other than the emissive region, are covered with a second planarization film 32 formed of an organic material which is similar to that used for the first planarization film 26.

A hole transport layer 34 is then formed over the entire surface of the second planarization film 32 and the transparent electrode 30. With such a configuration, because the second planarization film 32 has an opening in the emissive region, the hole transport layer 34 is in direct contact with the transparent electrode 30, which serves as an anode, in the emissive region. On the hole transport layer 34, an emissive layer 36 and an electron transport layer 38 which are slightly larger than the emissive region are sequentially accumulated in this order for each pixel. On these layers, a cathode 40 made of aluminum or the like is formed. It is preferable that the cathode 40 is formed of lithium fluoride (LiF) and aluminum (Al) which are sequentially formed in this order in a laminate structure.

Accordingly, when the second TFT is turned on, current is supplied via the source electrode 24 to the transparent electrode 30 of the organic EL element, and flows between the transparent electrode 30 and the cathode 40. In accordance with the current, the organic EL element emits light.

According to the present embodiment, a stress reducing layer 42 and a moisture block layer 44 are sequentially formed in this order so as to cover the whole surface of the cathode 40. The stress reducing layer 42 is formed of an organic material, particularly preferably an organic material which forms the organic EL element. In this embodiment, $Alq_3$ is used for the stress reducing layer 42. $Alq_3$ is a material which emits green light and is used for the emissive layer 36, and is also used for the hole transport layer 34 for the purpose of utilizing its hole transporting ability. It is also preferable that a material which is the same as that used for the electron transport layer 38 is used for the stress reducing layer 42. Furthermore, CuPc having electron transporting ability can be used instead of $Alq_3$.

Further, the moisture block layer 44 which is formed on the stress reducing layer 42 is formed of an inorganic material which does not allow transmission of moisture, and is formed, in this embodiment, by a layer having a laminate structure of lithium fluoride and aluminum which is the same as that used in the cathode 40. Further, silicon nitride (SiNx), molybdenum (Mo), or the like may also be used for the moisture block layer 44. A UV resin, Siox, SiON or the like may further be used.

As described above, in this embodiment, the moisture block layer 44 is formed on the cathode 40 via the stress reducing layer 42. It is therefore possible to reliably prevent moisture from diffusing into the organic layers of the organic EL element formed under the cathode 40. In particular, due to provision of the stress reducing layer 42, which is formed of an organic material and functions as a layer which reduces stress, a problem that the cathode 40 removes off the organic layers due to the stress, for example, can be prevented.

Further, by forming the stress reducing layer 42 immediately after formation of the cathode 40, the stress reducing layer 42 can serve as a protective layer for the cathode 40. It is therefore possible to reduce adverse effects on the cathode 40 even when the moisture block layer 44 is formed in a separate vacuum chamber by moving the substrate to the chamber, for example.

While materials for the stress reducing layer 42 and the moisture block layer 44 are not limited to those described above, because the materials described above are also used for forming the organic EL panel of the present embodiment, when these materials are used it is possible to form the stress reducing layer 42 and the moisture block layer 44 using equipments which have been already used in the previous manufacturing steps.

Normally, a single vacuum chamber is segmented into compartments each used for forming each organic layer of the organic EL element and the cathode 40, and a substrate is sequentially moved to each compartment for forming each layer by vapor deposition. In such a case, the stress reducing layer 42 and the moisture block layer 44 are formed in the compartments which were already used for forming other layers.

Typically, a layer of silicon nitride is formed by CVD and a layer of molybdenum is formed by sputtering. Accordingly, when a material used in a step other than the steps for forming the organic EL element is used for the stress reducing layer 42 and the moisture block layer 44, the operation for forming these layers becomes complicated.

In the above configuration, the cathode 40, the stress reducing layer 42, and the moisture block layer 44 are formed to thicknesses of approximately 400 nm, 150 nm, and 400 nm, respectively. Further, while each of the stress reducing layer 42 and the moisture block layer 44 is formed as a single layer in the above example, these layers may have a multi-layer structure having similar stress reducing layer 42 and moisture block layer 44 accumulated thereon.

Figure 2:
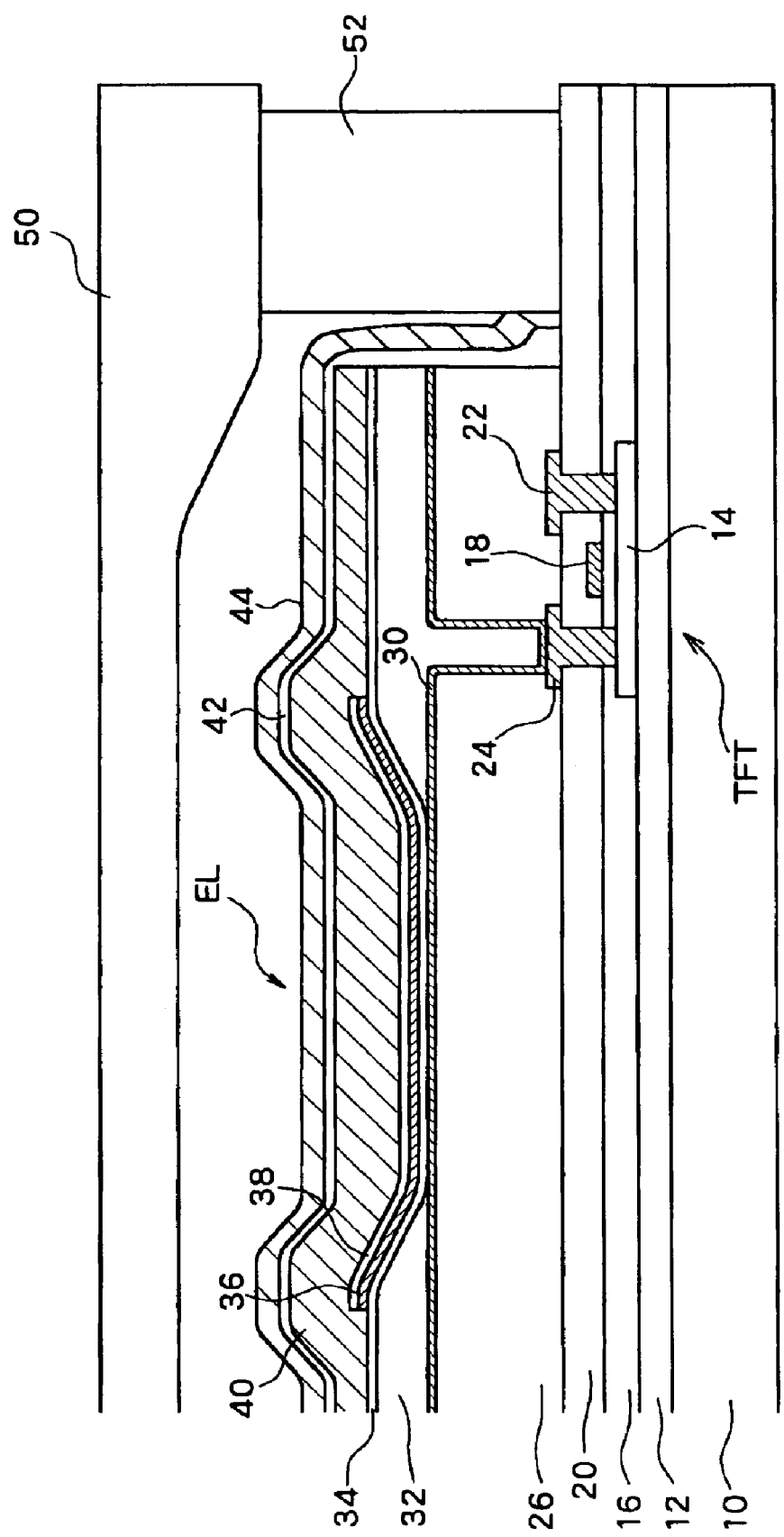
FIG. 2 is a cross sectional view showing a main portion of another configuration according to the embodiment of the present invention.
Figure 3:
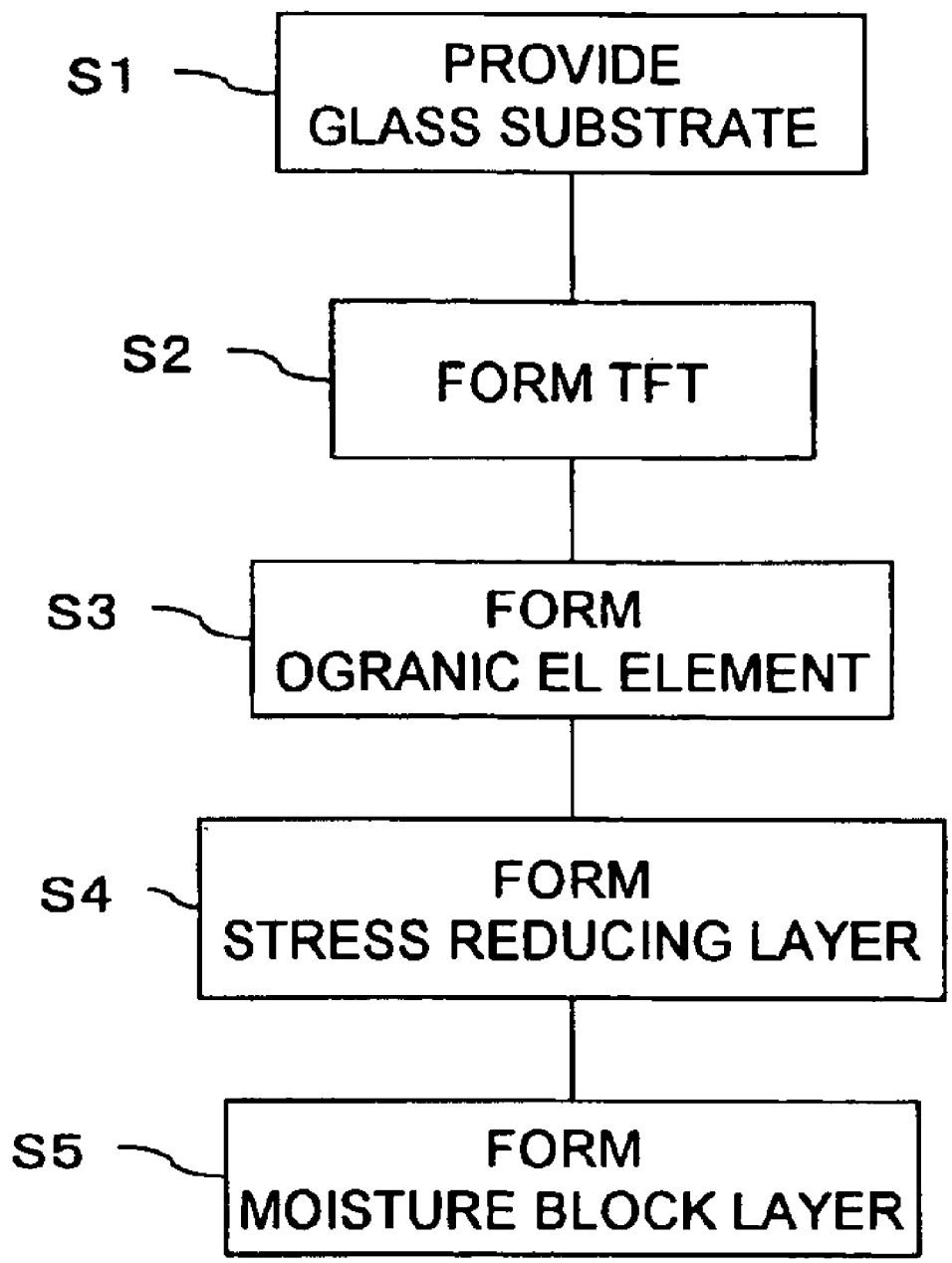
FIG. 3 is a flowchart showing a manufacturing procedure.

Further, FIG. 1 shows an example configuration in which the end portions of the stress reducing layer 42 and the moisture block layer 44 terminate without hanging down. As shown in FIG. 2, it is preferable to cause the end portions of the stress reducing layer 42 and the moisture block layer 44 to hang down to the surface of the first planarization film 26, thereby covering the side ends of the organic layers or the like.

While FIG. 1, which is a cross sectional view showing a main portion, shows only one pixel having one organic EL element, a plurality of pixels having the above configuration are actually disposed in a matrix. In a peripheral portion of the display region where these pixels are disposed in a matrix, a horizontal driving circuit and a vertical driving circuit for driving each pixel, as well as other connecting lines are formed. To a TFT substrate on which these circuits are formed, a sealing substrate is connected only in the peripheral region so as to make the substrates air-proof, thereby forming an EL panel.

An organic EL panel is formed according to the procedure shown in FIG. 2, for example. First, a glass substrate 10 is provided (S1), and a great number of TFTs are formed on the grass substrate (S2). Then, an anode 30, organic layers including a hole transport layer 34, an emissive layer 36, and an electron transport layer 38, and a cathode 40 are formed to form an organic EL element (S3).

After the organic EL element is formed as described above, a stress reducing layer 42 is formed (S4). In the present embodiment, the stress reducing layer 42 is formed by a material which is the same as that used in either the hole transport layer 34, the emissive layer 36, or the electron transport layer 38. Accordingly, as a vacuum chamber for forming the stress reducing layer 42, the vacuum chamber which was used for forming the organic layers of the organic EL element can be used.

Then, a moisture block layer 44 is formed on the stress reducing layer 42 (S5). In the present embodiment, the moisture block layer 44 is formed by a material which is the same as that used for the cathode 40. Accordingly, as a vacuum chamber for forming the moisture block layer 44, the vacuum chamber which was used for forming the cathode 40 can be used.

While the preferred embodiment of the present invention has been described using specific terms, such description is for illustrative purposes only, and it is to be understood that changes and variations may be made without departing from the spirit or scope of the appended claims.

What is claimed is:

1. A method for manufacturing an organic EL panel having a plurality of organic EL elements arranged in a matrix on a substrate, in which each organic EL element includes an anode, a cathode, and an organic emissive layer disposed between the anode and the cathode, and the cathode is formed as a common electrode for the plurality of organic EL elements arranged in a matrix, the method comprising:

after formation of the common cathode, sequentially forming, on the cathode, a stress reducing layer and a moisture block layer in this order, wherein the moisture block layer prevents moisture from entering the layers under the cathode, wherein the stress reducing layer is formed of Alq.

2. A method for manufacturing an organic EL panel having a plurality or organic EL elements arranged in a matrix on a substrate, in which each organic EL element includes an anode, a cathode, and an organic emissive layer disposed between the anode and the cathode, and the cathode is formed as a common electrode for the plurality of organic EL elements arranged in a matrix, the method comprising:

after formation of the common cathode, sequentially forming, on the cathode, a stress reducing layer and a moisture block layer in this order, wherein the moisture block layer prevents moisture from entering the layers under the cathode, wherein the stress reducing layer and organic layers of the organic EL element are formed of the same material and formed in the same chamber, wherein the stress reducing layer is formed of Alq.

3. A method for manufacturing an organic EL panel having a plurality of organic EL elements arranged in a matrix on a substrate, in which each organic EL element includes an anode, a cathode, and an organic emissive layer disposed between the anode and the cathode, and the cathode is formed as a common electrode for the plurality of organic EL elements arranged in a matrix, the method comprising:

after formation of the common cathode, sequentially forming, on the cathode, a stress reducing layer and a moisture block layer in this order, wherein the moisture block layer prevents moisture from entering the layers under the cathode, wherein the stress reducing layer is formed of a material used for forming an organic layer covering whole pixels, and wherein the stress reducing layer is formed of the same material as that for an electron transportation layer.

4. A method for manufacturing an organic EL panel having a plurality of organic EL elements arranged in a matrix on a substrate, in which each organic EL element includes an anode, a cathode, and organic layers disposed between the anode and the cathode, and the cathode is formed as a common electrode for the plurality of organic EL elements arranged in a matrix, the method comprising:

after formation of the common cathode, sequentially forming, on the cathode, a stress reducing layer and a moisture block layer in this order, wherein the moisture block layer prevents moisture from entering the layers under the cathode, wherein the stress reducing layer and one of the organic layers of the organic EL element are formed of the same material and formed in the same chamber, wherein the stress reducing layer is formed of a material used for forming the one of the organic layers being formed covering all pixels.

5. The method for manufacturing of claim 4, wherein the stress reducing layer is formed of the same material as that for a hole transportation layer.

6. The method for manufacturing of claim 4, wherein the stress reducing layer is formed of the same material as that for an electron transportation layer.

* * * * *